(12) United States Patent
Yin et al.

(10) Patent No.: US 6,696,750 B1
(45) Date of Patent: Feb. 24, 2004

(54) SEMICONDUCTOR PACKAGE WITH HEAT DISSIPATING STRUCTURE

(75) Inventors: Cha-Yun Yin, Taichung (TW); Ming-Chun Laio, Taichung (TW); Fu-Di Tang, Taichung (TW); Chien-Ping Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/395,561

(22) Filed: Mar. 24, 2003

(30) Foreign Application Priority Data

Jan. 10, 2003  (TW) .......................... 92100465 A

(51) Int. Cl.⁷ ............................................ H01L 23/495
(52) U.S. Cl. .................... 257/675; 257/796; 257/706
(58) Field of Search ................................ 257/796, 787, 257/706, 707, 675, 676, 666

(56) References Cited

U.S. PATENT DOCUMENTS

| | | |
|---|---|---|
| 5,328,870 A | 7/1994 | Marrs .......................... 437/216 |
| 5,381,042 A | 1/1995 | Lerner et al. ................ 257/712 |
| 5,444,602 A | 8/1995 | Banerjee et al. ............ 361/705 |
| 5,489,801 A | 2/1996 | Blish, II ...................... 257/675 |
| 5,530,295 A | 6/1996 | Mehr ........................... 257/796 |
| 5,598,034 A | 1/1997 | Wakefield .................... 257/706 |
| 5,608,267 A | 3/1997 | Mahulikar et al. .......... 257/796 |
| 5,796,159 A | 8/1998 | Kierse ......................... 257/668 |
| 6,329,706 B1 * | 12/2001 | Nam |
| 6,436,550 B2 * | 8/2002 | Sakata et al. |
| 6,437,427 B1 * | 8/2002 | Choi |
| 6,624,523 B2 * | 9/2003 | Chao et al. |

* cited by examiner

Primary Examiner—Sheila V. Clark
(74) Attorney, Agent, or Firm—Peter F. Corless; Steven M. Jensen; Edwards & Angell, LLP

(57) ABSTRACT

A semiconductor package with a heat dissipating structure is provided, including a lead frame with a die pad for allowing a chip to be mounted on an upper surface of the die pad, and a heat sink abutting against a lower surface of the die pad. A top surface of the heat sink, in contact with the lower surface of the die pad, is formed with at least a recessed portion. During a molding process of using a resin material to form an encapsulant for encapsulating the chip, lead frame and heat sink, the resin material fills into the recessed portion and forms a supporting member between the die pad and heat sink to provide support for a central portion of the die pad, so as to prevent the chip from cracking in a step of building up a packing pressure of the molding process, thereby assuring yield and reliability of fabricated products.

11 Claims, 4 Drawing Sheets

SEMICONDUCTOR PACKAGE WITH HEAT DISSIPATING STRUCTURE

FIELD OF THE INVENTION

The present invention relates to semiconductor packages with heat dissipating structures, and more particularly, to a semiconductor package having a heat sink whose surface is exposed to outside of a chip-encapsulation encapsulant so as to improve heat dissipating efficiency of the semiconductor package.

BACKGROUND OF THE INVENTION

Generally in semiconductor packages, a molding resin or encapsulation compound used for encapsulating chips is mostly a material having poor thermal conductivity such as epoxy resin, making heat produced from operation of the chips not able to be effectively dissipated via the molding resin to the atmosphere, which may thereby degrade reliability of the semiconductor packages especially for those mounted with highly integrated chips therein.

For solving the above heat dissipation problem, it is desired to incorporate a heat sink or heat spreader in a semiconductor package and expose a surface of the heat sink to outside of an encapsulant that encapsulates a chip mounted in the semiconductor package by which heat produced from the chip can be directly dissipated via the exposed surface of the heat sink to the atmosphere, thereby effectively enhancing heat dissipating efficiency. Such a package structure with an exposed heat sink is taught by U.S. Pat. Nos. 5,796,159, 5,598,034 and 5,608,267 in which the heat sink is attached by means of an adhesive to and below a die pad or leads of a lead frame.

However, the foregoing attachment between the heat sink and the lead frame via the adhesive would undesirably make fabrication processes more complex and cost-ineffective to implement. Accordingly, U.S. Pat. Nos. 5,328,870, 5,381,042, 5,444,602, 5,489,801 and 5,530,295 disclose a semiconductor package not having to adhere a heat sink to a lead frame; this type of package structure is named EDHS-QFP (exposed drop-in heat sink-quad flat package) generally fabricated by procedural steps illustrated in FIGS. 4A to 4D. Referring to FIG. 4A, an encapsulation mold 20 is prepared for use in a molding process and composed of an upper mold 21 and a lower mold 22, each of the upper and lower molds 21, 22 having a cavity 210, 220 respectively. Then, a heat sink 23 is placed in a drop-in manner into the cavity 220 of the lower mold 22, with a bottom surface 230 of the heat sink 23 abutting against a bottom wall of the cavity 220 of the lower mold 22.

Referring to FIG. 4B, a die-bonded and wire-bonded lead frame 24 is stacked on the heat sink 23. A chip 25 is mounted on a surface of a die pad 240 of the lead frame 24 and electrically connected to inner leads 241 of the lead frame 24 via a plurality of bonding wires 26, allowing a surface of the die pad 240, opposite to the surface mounted with the chip 25, to be in contact with a top surface 231 of the heat sink 23.

Subsequently, referring to FIG. 4C, when a mold engaging process is performed to engage the upper mold 21 with the lower mold 22, outer leads 242 of the lead frame 24 are clamped between the upper and lower molds 21, 22, and the chip 25 and bonding wires 26 formed on the lead frame 24 are received within the cavity 210 of the upper mold 21. With the upper mold 21 being coupled to the lower mold 22, a resin injecting process is performed by which a resin material such as epoxy resin is injected into the cavities 210, 220 of the upper and lower molds 21, 22 to form an encapsulant 27 that hermetically encapsulates the chip 25, the bonding wires 26, the heat sink 23, and the die pad 240 and inner leads 241 of the lead frame 24, allowing these encapsulated elements to be protected against damage from external moisture or contaminant. As there is no adhesive applied between the heat sink 23 and the die pad 240, during mold engagement, the die pad 240 and tie bars (not shown) connected thereto are adapted to provide a downward pressing force to press the die pad 240 toward the heat sink 23; in particular, the die pad 240 is usually spaced apart from the bottom wall of the cavity 220 of the lower mold 22 by a distance smaller than a thickness of the heat sink 23 by about 2–3 mils, whereby the tie bars are tensioned and rebound to allow the die pad 240 to abut against the heat sink 23. Such a method to first place the heat sink 23 in the cavity 220 and then stack the die pad 240 on the heat sink 23 without having to beforehand adhere the heat sink 23 to the die pad 240 via an adhesive can thereby simplify fabrication processes and reduce production costs.

Then, by removing the encapsulation mold 20 from the lead frame 24, the encapsulant 27 is completely formed on the lead frame 24, with the bottom surface 230 of the heat sink 23 and the outer leads 242 being exposed to outside of the encapsulant 27, as shown in FIG. 4D. The exposed heat sink 23 facilitates dissipation of heat produced from the chip 25, and the exposed outer leads 242 can be bent or deformed to be input/output (I/O) ports of the semiconductor package, which are electrically connected to an external device such as printed circuit board (PCB, not shown) so as to allow the chip 25 to operate via the external device.

However, the above EDHS-QFP structure still renders significant drawbacks. As no adhesive is applied between the heat sink and the die pad, such an interface may be considered delaminated and undesirably forms a gap between the heat sink 23 and the die pad 240. This gap is normally small and not permeable for the resin material used to fabricate the encapsulant 27, as shown in FIG. 5A, thereby forming a delaminated interface between the heat sink 23 and the die pad 240 with air residing in the gap. Since air has poor thermal conductivity of 0.024 W/M° C., heat produced from the chip 25 and transmitted through the die pad 240, the gap (air), and the heat sink 23 would undesirably increase thermal transfer resistance and degrade heat dissipating efficiency.

On the other hand, if the small gap between the heat sink 23 and the die pad 240 may be partly filled with the resin material and leaves a void 28 formed in the middle of the gap, as shown in FIG. 5B; as a result, a central portion of the die pad 240 lacks support and the chip 25 may easily crack (as indicated by arrows in the drawing) due to impact from a flow of the resin material especially in a step of building up a packing pressure of the molding process, thereby seriously damaging quality and yield of fabricated products. This chip-cracking situation is more severe for relatively thinner chips. As chips are developed toward high integration and low profile, the larger a chip, the thinner the chip is (for example, even having a thickness smaller than 10 mils), and correspondingly a larger die pad is required, which makes it even harder to completely fill the gap between the heat sink and the die pad and thereby easily leads to void-induced chip cracks. Besides, similarly, air of poor thermal conductivity residing in the void 28 may increase thermal transfer resistance and degrade heat dissipating efficiency as to transmit heat from the chip 25 to the heat sink 23 for dissipation.

Therefore, the problem to be solved herein is to provide a semiconductor package which can prevent chip cracks, improve heat dissipating efficiency and reduce fabrication costs thereof.

SUMMARY OF THE INVENTION

An objective of the present invention is to provide a semiconductor package with a heat dissipating structure in which a resin material forms a supporting member between a die pad of a lead frame and a heat sink to provide proper support for the die pad, so as to prevent cracks of a chip mounted on the die pad during a molding process, thereby assuring yield and reliability of fabricated products.

Another objective of the invention is to provide a semiconductor package with a heat dissipating structure in which a bottom surface of a heat sink is exposed to outside of an encapsulant used for encapsulating a chip incorporated in the semiconductor package without forming a delaminated interface or void between the heat sink and a die pad wherein the chip is mounted, thereby improving heat dissipating efficiency of the overall package structure.

A further objective of the invention is to provide a semiconductor package with a heat dissipating structure in which a die pad is directly stacked on a heat sink without having to use an adhesive for adhering the heat sink to the die pad, thereby reducing production costs and simplifying fabrication processes.

In accordance with the foregoing and other objectives, the present invention proposes a semiconductor package with a heat dissipating structure, comprising: a lead frame with a die pad, the die pad having an upper surface and a lower surface opposed to the upper surface; at least a chip mounted on the upper surface of the die pad and electrically connected to the lead frame; a heat sink having a top surface and a bottom surface opposed to the top surface, the top surface being formed with at least a recessed portion of a predetermined depth, wherein the top surface of the heat sink comes into contact with the lower surface of the die pad; and an encapsulant for encapsulating the chip, the heat sink and part of the lead frame, wherein the recessed portion of the heat sink is filled with a resin material used for forming the encapsulant, and the bottom surface of the heat sink is exposed to outside of the encapsulant.

The above semiconductor package with a heat sink can yield significant benefits. A top surface of the heat sink is formed with at least a recessed portion having at least an opening at an edge of the heat sink, and the opening is directed in parallel to a flow direction of a resin material used for forming an encapsulant that encapsulates a chip mounted on a die pad of a lead frame. During a molding process, the die pad of the lead frame is stacked on the top surface of the heat sink with the recessed portion being disposed between the die pad and the heat sink, whereby the recessed portion enlarges a gap between the heat sink and the die pad and facilitates the resin material to smoothly fill into the gap and the recessed portion via the opening of the recessed portion to form a supporting member between the die pad and the heat sink thereby without leaving a delaminated interface or void between the die pad and the heat sink. With part of the recessed portion of the heat sink corresponding in position to a central portion of the die pad, the supporting member can provide proper support for the central portion of the die pad, so as to prevent the chip mounted on the die pad from cracking in a step of building up a packing pressure of the molding process, thereby assuring yield and reliability of fabricated products. Since the gap between the heat sink and the die pad is filled with the resin material having thermal conductivity of 0.8 W/M° C. significantly greater than that of air (0.024 W/M° C.), heat produced from the chip can be more efficiently transmitted through the die pad, the gap (resin material), and the heat sink for dissipation as compared to the prior art in which a thermal transfer path includes air residing in a delaminated interface or void between the die pad and the heat sink; therefore, the proposed semiconductor package desirably reduces thermal transfer resistance and enhances heat dissipating efficiency. Moreover, a bottom surface of the heat sink is exposed to outside of the encapsulant and helps dissipate the heat from the chip, thereby further improving the heat dissipating efficiency of the semiconductor package. In addition, the die pad of the lead frame is directly stacked on the heat sink without having to use an adhesive for adhering the heat sink to the die pad, thereby reducing production costs and simplifying fabrication processes.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package with a heat dissipating structure proposed by the present invention are described in detail as follows with reference to FIGS. 1, 2A–2D and 3A–3D.

Figure 1:
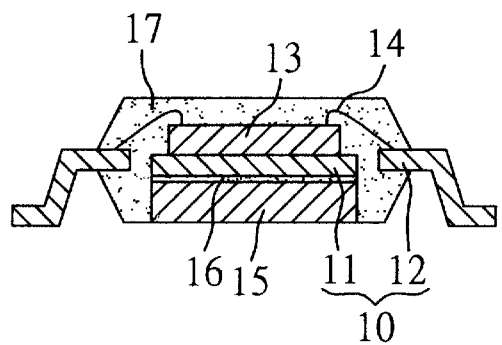
FIG. 1 is a cross-sectional view of a semiconductor package according to the invention.

As shown in FIG. 1, the semiconductor package according to the invention uses a lead frame as a chip carrier, which comprises: a lead frame 10 having a die pad 11 and a plurality of leads 12 surrounding the die pad 11; at least a chip 13 mounted on the die pad 11; a plurality of bonding wires 14 for electrically connecting the chip 13 to the leads 12 of the lead frame 10; a heat sink 15 formed with at least a recessed portion 16 on a surface thereof, wherein the surface of the heat sink 15 comes into contact with the die pad 11; and an encapsulant 17 for encapsulating the chip 13, the bonding wires 14, the heat sink 15 and part of the lead frame 10, wherein the recessed portion 16 of the heat sink 15 is filled with a resin material used for forming the encapsulant 17.

The above semiconductor package can be fabricated by procedural steps shown in FIGS. 2A to 2D.

Figure 2A:
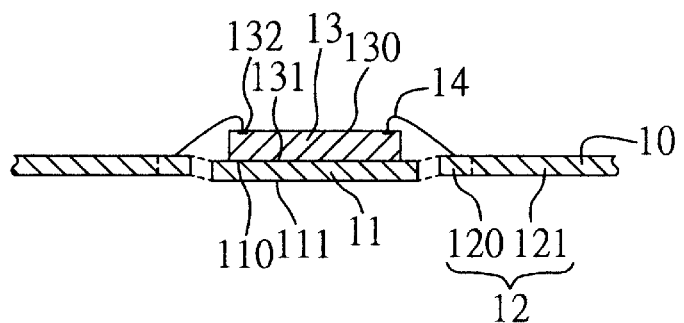
FIGS. 2A–2D are schematic diagrams of procedural steps for fabricating the semiconductor package shown in FIG. 1.

Referring to FIG. 2A, the first step is to prepare a lead frame 10 made of a conductive metal such as copper. The lead frame 10 is at least formed with a die pad 11 and a plurality of leads 12 surrounding the die pad 11. The die pad 11 has an upper surface 110 and a lower surface 111 opposed to the upper surface 110. Each of the leads 12 is composed of an inner lead 120 and an outer lead 121, wherein the inner lead 120 is directed toward the die pad 11 and spaced apart from the die pad 11 by an appropriate distance. Fabrication of the lead frame 10 employs conventional techniques that are not to be further detailed herein.

Then, at least a chip 13 is prepared, having an active surface 130 formed with a plurality of electronic elements and circuits (not shown) thereon and a non-active surface 131 opposed to the active surface 130. The active surface 130 of the chip 13 is further formed with a plurality of bond pads 32 that are to be subsequently connected with conductive elements for electrical connection purposes.

A die bonding process is performed by which the non-active surface 131 of the chip 13 is attached to the upper surface 110 of the die pad 11 via an adhesive (not shown). Then, a wire bonding process is performed to form a plurality of conductive elements such as bonding wires 14 on the lead frame 10; the bonding wires 14 are bonded to the bond pads 132 on the active surface 130 of the chip 13 and to the inner leads 120 of the lead frame 10 respectively to thereby electrically connect the chip 13 to the lead frame 10.

Figure 2B:
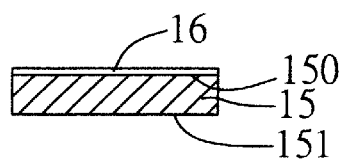
Figure 3A:
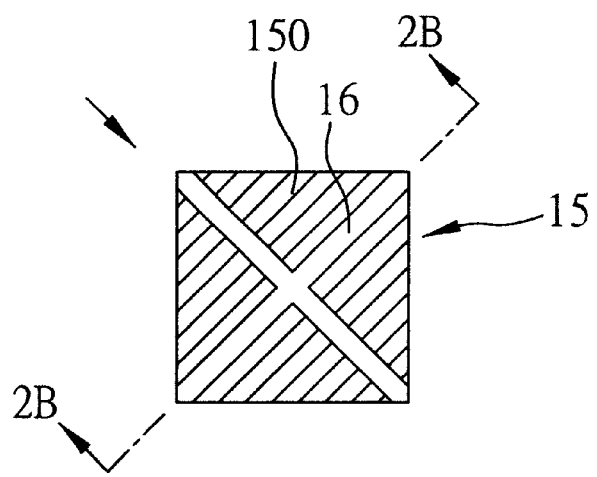
FIG. 3A is a top view of an embodiment of a heat sink in the semiconductor package according to the invention.
Figure 3B:
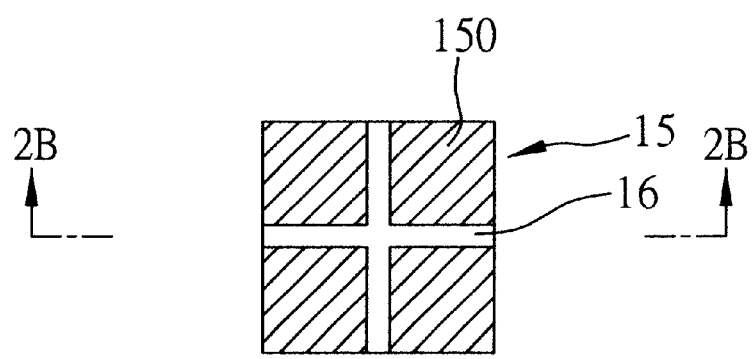
FIG. 3B is a top view of another embodiment of the heat sink in the semiconductor package according to the invention.
Figure 4A:
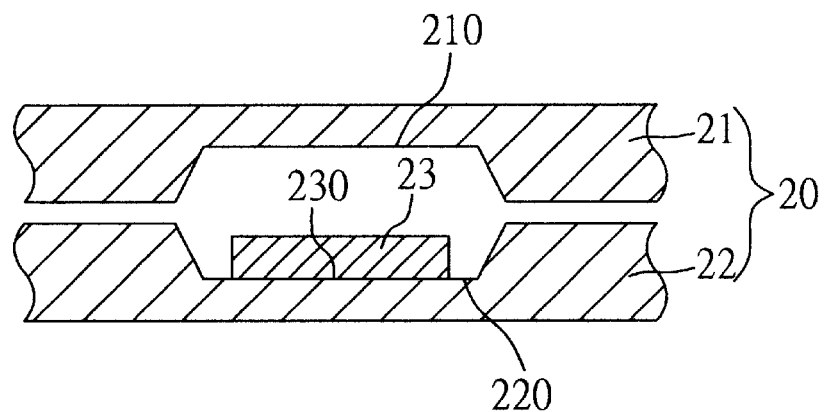
FIGS. 4A–4D (PRIOR ART) are schematic diagrams of procedural steps for fabricating a conventional semiconductor package.
Figure 4B:
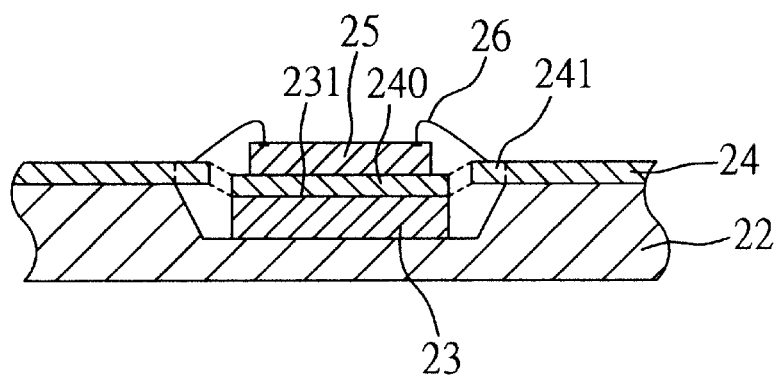
Figure 4C:
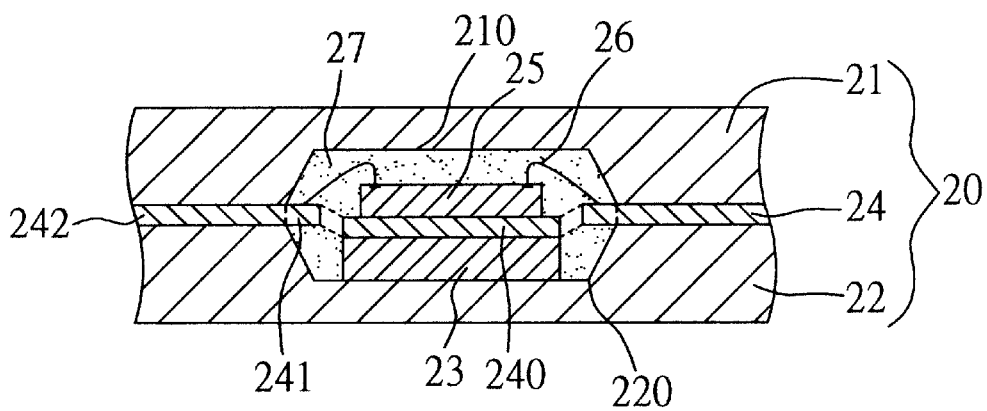
Figure 4D:
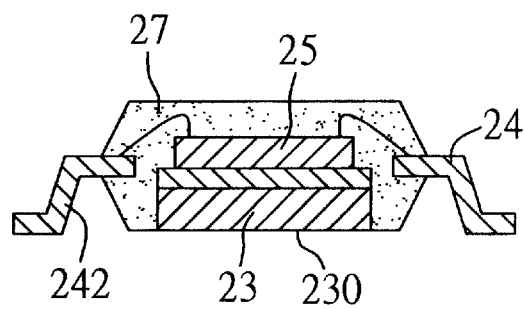
Figure 5A:
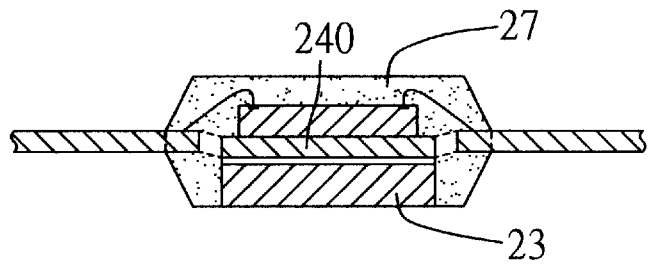
FIG. 5A (PRIOR ART) is a schematic diagram showing delamination in a conventional semiconductor package.
Figure 5B:
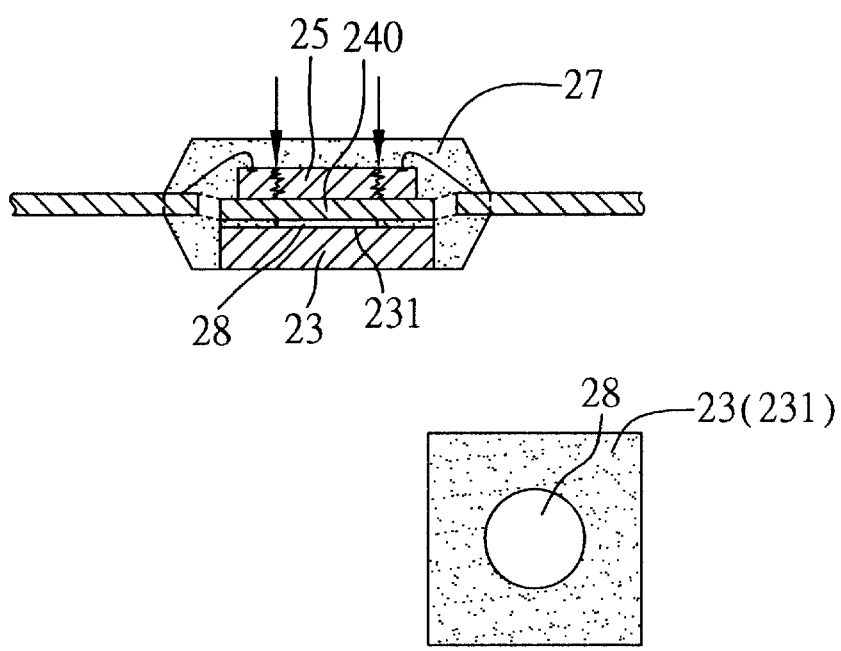
FIG. 5B (PRIOR ART) is a schematic diagram showing chip cracks in a conventional semiconductor package.

Referring to FIG. 2B, a heat sink 15 made of a thermally conductive metal such as aluminum is prepared, having a top surface 150 and a bottom surface 151 opposed to the top surface 150. The top surface 150 of the heat sink 15 is formed with at least a recessed portion 16 of a predetermined depth larger than a minimum filler size of a resin material subsequently used for encapsulating the chip 13; the depth of the recessed portion 16 is about 2–10 mils and preferably 5 mils. As shown in FIGS. 3A and 3B, the recessed portion 16 has at least an opening at an edge of the heat sink 15 for allowing the resin material to fill into the recessed portion 16 via the opening; preferably, the opening of the recessed portion 16 is directed in parallel to a flow direction of the resin material as indicated by an arrow in FIG. 3A. As shown in FIG. 3A, the recessed portion 16 is of a X shape that extends from the center of the top surface 150 of the heat sink 15 toward four corners; alternatively, as shown in FIG. 3B, the recessed portion 16 is shaped as a cross extending from the center of the top surface 150 toward four edges of the heat sink 15. It should be understood that the recessed portion 16 is not limited to the shapes illustrated herein but can be formed as various geometric shapes. Moreover, part of the recessed portion 16 is preferably adapted to correspond in position to a central portion of the die pad 11 in a subsequent molding process, for example (but not limited to) the intersection of the recessed portion 16 shown in FIGS. 3A and 3B.

Figure 2C:
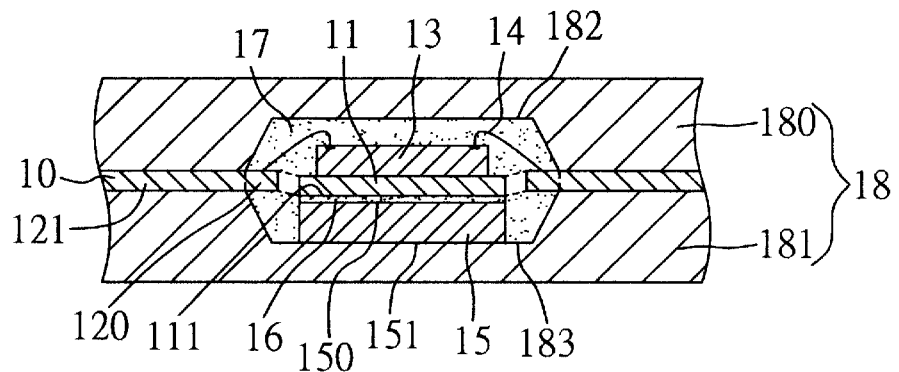

Referring to FIG. 2C, a molding process is performed by which a conventional encapsulation mold 18 is used to form an encapsulant 17 by a resin material such as epoxy resin on the lead frame 10. The encapsulation mold 18 has an upper mold 180 and a lower mold 181, wherein the upper mold 180 is formed with an upwardly-recessed upper cavity 182 for accommodating the chip 13 and the bonding wires 14, and the lower mold 181 is correspondingly formed with a downwardly-recessed lower cavity 183 for receiving the heat sink 15. First, it is to place the heat sink 15 in the lower cavity 183 of the lower mold 181 with the bottom surface 151 of the heat sink 15 abutting against a bottom wall of the lower cavity 183 and with the top surface 150 of the heat sink 15 facing upwardly. Then, the die-bonded and wire-bonded lead frame 10 shown in FIG. 2A is stacked on the heat sink 15 in a manner that, the lower surface 111 of the die pad 11 comes into contact with the top surface 150 of the heat sink 15 and the intersection of the recessed portion 16 of the heat sink 15 (shown in FIGS. 3A an 3B) corresponds in position to the central portion of the die pad 11. This method of first placing the heat sink 15 in the lower cavity 183 and then stacking the die pad 11 directly on the heat sink 15 without using an adhesive to adhere the heat sink 15 to the die pad 11 is customarily referred to as "drop-in" technique.

Subsequently, a mold engaging process is performed to engage the upper mold 180 with the lower mold 181 by which the outer leads 121 of the lead frame 10 are clamped between the upper and lower molds 180, 181, and the chip 13 and bonding wires 14 are received within the upper cavity 182 of the upper mold 180. With engagement of the upper and lower molds 180, 181, a resin injecting process is performed to inject a resin material such as epoxy resin into the upper and lower cavities 182, 183 and form an encapsulant 17 encapsulating the chip 13, the bonding wires 14, the heat sink 15, and the die pad 11 and inner leads 120 of the heat sink 10, whereby these encapsulated elements are protected against damage from external moisture or contaminant. At the same time, since the recessed portion 16 enlarges a gap between the die pad 11 and the heat sink 15, the resin material would also flow into the gap and the recessed portion 16 via the opening, at the edge of the heat sink 15, of the recessed portion 16. As the depth of the recessed portion 16 is larger than a minimum filler size of the resin material and the opening of the recessed portion 16 is preferably directed in parallel to a flow direction of the resin material, the flow of resin material can smoothly fill into the recessed portion 16 and the gap between the die pad 11 and the heat sink 15 to form a supporting member between the die pad 11 and the heat sink 15 without leaving a delaminated interface or void therebetween.

Figure 2D:
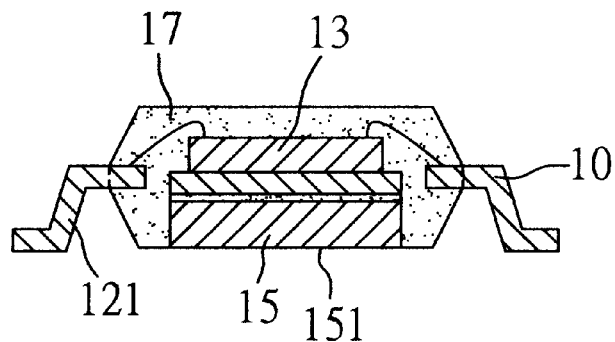

After the above molding and resin injecting processes are completed, the encapsulation mold 18 is removed from the lead frame 10, and thus the encapsulant 17 is completely fabricated on the lead frame 10 shown in FIG. 2D. Since the bottom surface 151 of the heat sink 15 abuts against the bottom wall of the lower cavity 183 and the outer leads 121 of the lead frame 10 are clamped between the upper and lower molds 180, 181 during molding and resin injection, the bottom surface 151 of the heat sink 15 and the outer leads 121 are exposed to outside of the encapsulant 17. As the gap between the die pad 11 and the heat sink 15 is filled with the resin material having thermal conductivity of 0.8 W/M° C. significantly greater than that of air (0.024 W/M° C.), heat produced from the chip 13 can be more efficiently transmitted through the die pad 11, the gap (resin material), and the heat sink 15 for dissipation as compared to the prior art in which a thermal transfer path includes air residing in a delaminated interface or void between the die pad and the heat sink. This thereby reduces thermal transfer resistance and enhances heat dissipating efficiency. Moreover, the heat sink 15 with the exposed bottom surface 151 also facilitates dissipation of heat produced from the chip 13 and further improves heat dissipating efficiency of the overall package structure. The exposed outer leads 121 can be bent or deformed to act as input/output (I/O) ports used to be electrically connected with an external device such as printed circuit board (PCB, not shown) by which the chip 13 may operate via the external device.

The above semiconductor package with a heat sink can yield significant benefits. A top surface of the heat sink is formed with at least a recessed portion having at least an opening at an edge of the heat sink, and the opening is directed in parallel to a flow direction of a resin material used for forming an encapsulant that encapsulates a chip mounted on a die pad of a lead frame. During a molding process, the die pad of the lead frame is stacked on the top surface of the heat sink with the recessed portion being disposed between the die pad and the heat sink, whereby the recessed portion enlarges a gap between the heat sink and the die pad and facilitates the resin material to smoothly fill into the gap and the recessed portion via the opening of the recessed portion to form a supporting member between the die pad and the heat sink thereby without leaving a delaminated interface or void between the die pad and the heat sink. As part of the recessed portion of the heat sink corresponds in position to a central portion of the die pad, the supporting member can provide proper support for the central portion of the die pad, so as to prevent the chip mounted on the die pad from cracking in a step of building up a packing pressure of the molding process, thereby assuring yield and reliability of fabricated products. Moreover, the gap between the heat sink and the die pad is filled with the resin material having significantly greater thermal conductivity than air as part of a thermal transfer path in the prior art, heat produced from the chip can be more efficiently transmitted through the die pad, the gap (resin material), and the heat sink for dissipation; thereby reducing thermal transfer resistance and enhancing heat dissipating efficiency. And, a bottom surface of the heat sink is exposed to outside of the encapsulant and helps dissipate the heat from the chip, thereby further improving the heat dissipating efficiency of the semiconductor package. In addition, the die pad of the lead frame is directly stacked on the heat sink without having to use an adhesive for adhering the heat sink to the die pad, thereby reducing production costs and simplifying fabrication processes.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a heat dissipating structure, comprising:

a lead frame with a die pad, the die pad having an upper surface and a lower surface opposed to the upper surface;

at least a chip mounted on the upper surface of the die pad and electrically connected to the lead frame;

a heat sink having a top surface and a bottom surface opposed to the top surface, the top surface being formed with at least a recessed portion of a predetermined depth, wherein the top surface of the heat sink comes into contact with the lower surface of the die pad; and an encapsulant for encapsulating the chip, the heat sink and part of the lead frame, wherein the recessed portion of the heat sink is filled with a resin material used for forming the encapsulant.

2. The semiconductor package of claim 1, wherein the recessed portion of the heat sink has at least an opening at an edge of the heat sink for allowing the resin material to fill into the recessed portion via the opening.

3. The semiconductor package of claim 2, wherein the opening of the recessed portion is directed in parallel to a flow direction of the resin material.

4. The semiconductor package of claim 2, wherein part of the recessed portion corresponds in position to a central portion of the die pad.

5. The semiconductor package of claim 4, wherein the resin material filling into the recessed portion forms a supporting member between the die pad and the heat sink to provide support for the central portion of the die pad, so as to prevent the chip mounted on the die pad from cracking during formation of the encapsulant.

6. The semiconductor package of claim 1, wherein the depth of the recessed portion is larger than a minimum filler size of the resin material.

7. The semiconductor package of claim 1, wherein the bottom surface of the heat sink is exposed to outside of the encapsulant.

8. The semiconductor package of claim 1, wherein the lead frame further comprises a plurality of leads surrounding the die pad, allowing the chip to be electrically connected to the leads via a plurality of conductive elements.

9. semiconductor package of claim 8, wherein the conductive elements are bonding wires.

10. The semiconductor package of claim 8, wherein each of the leads is composed of an inner lead and an outer lead, the inner lead being directed toward the die pad, and the outer lead being exposed to outside of the encapsulant.

11. The semiconductor package of claim 1, wherein the resin material is epoxy resin.

* * * * *